United States Patent
Rhodes et al.

(10) Patent No.: US 7,990,445 B2
(45) Date of Patent: Aug. 2, 2011

(54) IMAGE SENSOR HAVING DIFFERING WAVELENGTH FILTERS

(75) Inventors: Howard E. Rhodes, San Martin, CA (US); Ian Montandon, Birkshire (GB)

(73) Assignee: OmniVision Technologies, Inc., Santa Clara, CA (US)

( * ) Notice: Subject to any disclaimer, the term of this patent is extended or adjusted under 35 U.S.C. 154(b) by 449 days.

(21) Appl. No.: 12/130,905

(22) Filed: May 30, 2008

(65) Prior Publication Data
US 2009/0295962 A1 Dec. 3, 2009

(51) Int. Cl.
*H04N 9/083* (2006.01)
(52) U.S. Cl. .......... 348/280; 348/372
(58) Field of Classification Search .......... None
See application file for complete search history.

(56) References Cited

U.S. PATENT DOCUMENTS

| | | | |
|---|---|---|---|
| 4,791,396 A | 12/1988 | Nishizawa et al. | |
| 5,282,025 A * | 1/1994 | Sato | 348/273 |
| 5,450,124 A * | 9/1995 | Sugiura et al. | 348/237 |
| 5,604,530 A * | 2/1997 | Saito et al. | 348/70 |
| 6,137,100 A * | 10/2000 | Fossum et al. | 250/208.1 |
| 6,628,331 B1 * | 9/2003 | Bean | 348/273 |
| 7,708,686 B2 * | 5/2010 | Venkataraman | 600/109 |
| 2001/0024237 A1 * | 9/2001 | Osada et al. | 348/273 |
| 2003/0098918 A1 * | 5/2003 | Miller | 348/273 |
| 2007/0158532 A1 * | 7/2007 | Lin | 250/208.1 |
| 2007/0201738 A1 * | 8/2007 | Toda et al. | 382/144 |
| 2007/0206110 A1 * | 9/2007 | Wada | 348/340 |
| 2007/0285539 A1 * | 12/2007 | Shimizu et al. | 348/272 |
| 2008/0062290 A1 * | 3/2008 | Lahav et al. | 348/280 |
| 2008/0074521 A1 * | 3/2008 | Olsen | 348/300 |
| 2008/0116454 A1 * | 5/2008 | Shimizu | 257/43 |
| 2009/0189234 A1 * | 7/2009 | Mabuchi | 257/432 |
| 2010/0289885 A1 * | 11/2010 | Lu et al. | 348/61 |

OTHER PUBLICATIONS

Lyon, Richard F. et al., "Eyeing the Camera: into the Next Century", in Proc. IS&T/SID 10th Color Imaging Conference, 2002, 7 pages.

* cited by examiner

*Primary Examiner* — David Ometz
*Assistant Examiner* — Angel L Garces-Rivera
(74) *Attorney, Agent, or Firm* — Blakely Sokoloff; Taylor & Zafman LLP

(57) ABSTRACT

An image sensor includes filters formed over a portion of an array of photosensitive elements in a predetermined pattern. The pattern can be such that the exposure of a matrix (such as a 2-by-2 square of pixels) to light (such as blue light) is improved, while maintaining acceptable capability to capture light across the entire spectrum. The pattern can be such that two blue filters, one red, and one green filter is used by a 2-by-2 square matrix of pixels. The pattern can also include cyan, yellow, and magenta (CYM) filters.

19 Claims, 6 Drawing Sheets

IMAGE SENSOR HAVING DIFFERING WAVELENGTH FILTERS

BACKGROUND

1. Field

The present disclosure relates to image sensors and, in particular, aspects of the present disclosure relate to color filter arrays for image sensors.

2. Discussion of Related Art

Image sensors are used to capture light in a way such that an electronic representation of an illuminated scene can be captured, manipulated, stored, and accessed. A typical image sensor can be fabricated using complementary metal oxide semiconductor (CMOS) technology. Charge couple device (CCD) technology is also suitable.

Conventional CMOS and CCD image sensors suffer from some limitations, however. Both CMOS and CCD images sensor have relatively poor sensitivity to blue light because blue light has a wavelength that is relatively short, and the photons are absorbed relatively close to the surface of the silicon that is used to form the image sensor. When the photons are absorbed close to the surface, there is typically recombination with surface states or recombination by holes due to the P+ surface of the image sensor. The recombination reduces the sensitivity of the sensor because the loss of free electrons reduces the amount of free electrons that are produced during integration (e.g., during an exposure time).

Furthermore, conventional image sensors use filters to capture photons of various wavelengths in different pixels. For example, red, green, and blue (RGB) filters are provided such that an image can be reproduced using an additive color scheme. Conventional image sensors often arrange each of the filters using a Bayer pattern. The pattern uses one red pixel, two green pixels in diagonally opposing corners, and one blue pixel (RGGB). Two green pixels are chosen because the human vision system is most responsive across the green portion of the visible light spectrum. However, using the filters in the RGGB format often results in images that have poor sensitivity to blue wavelengths of light and that have poor noise characteristics. The above problems are typically made especially worse in low light situations.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

In the below description, numerous specific details, such as, for example, particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics can be combined in any suitable manner in one or more embodiments.

Embodiments of the present disclosure include image sensor include filters formed over a portion of an array of photosensitive elements in a predetermined pattern. The pattern can be such that the exposure of a unit matrix (such as a 2-by-2 square of four pixels) to light (such as blue light) is improved, while maintaining acceptable capability to capture light across the entire spectrum. The pattern can be such that two blue filters, one red, and one green filter is used by a 2-by-2 square of pixels. The pattern can also include cyan, yellow, and magenta (CYM) filters. The pattern can also include filters from different color systems, such as a cyan filter used with red, green, and blue filters.

Figure 1:
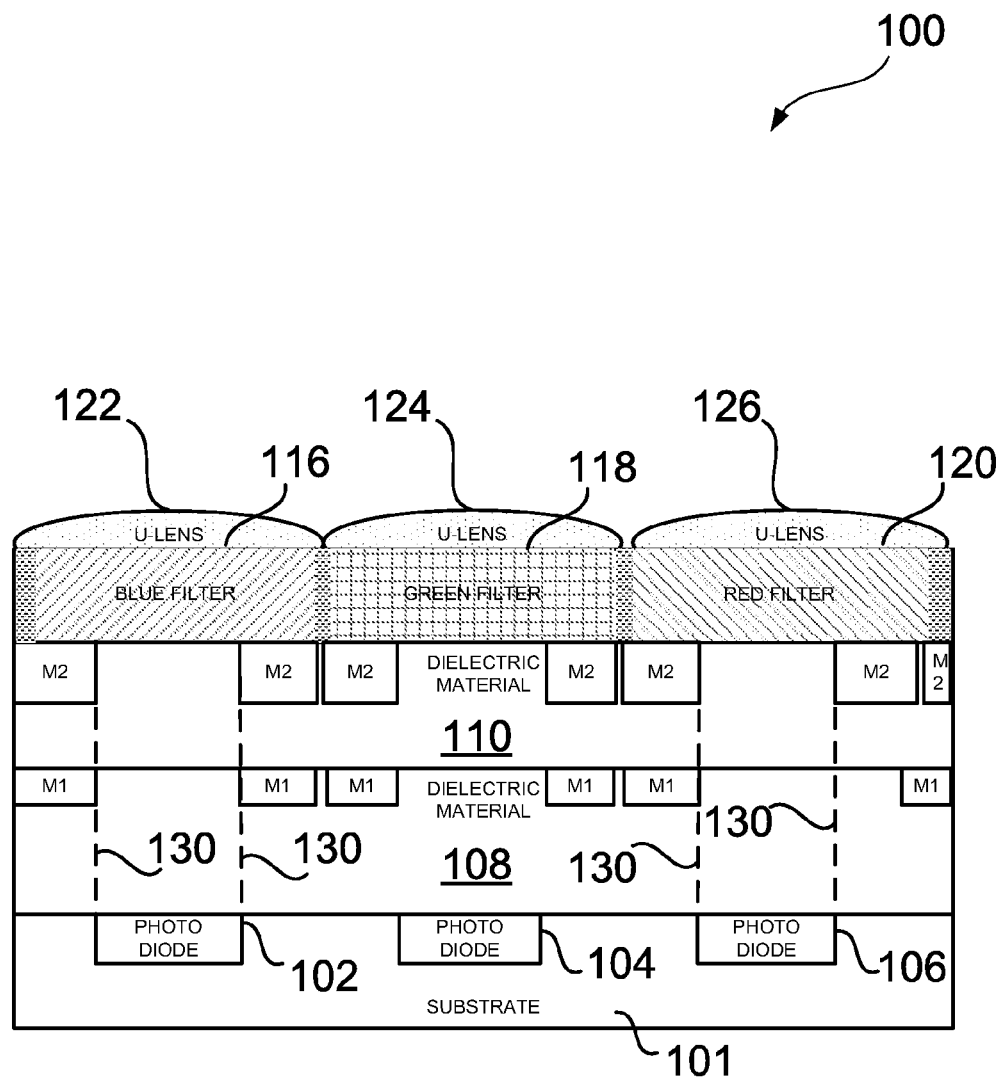
FIG. 1 is a side view illustrating sample filters arranged in a pattern over an array of photosensitive elements in an image sensor 100.

FIG. 1 is a side view illustrating sample filters arranged in a pattern over an array of photosensitive elements in an image sensor 100. For simplicity, the Figure is not drawn to scale. Generally, the image sensor 100 includes several photosensitive elements arranged in an array of two dimensional rows and columns across a substrate 101. The Figure illustrates three photosensitive elements 102, 104, and 106, which are shown as photodiodes 102, 104, and 106. The array can include hundreds or thousands of rows and/or columns, or more. Additionally, the array can have an arrangement other than rectilinear columns and rows.

The substrate 101 can be a semiconductor substrate. For many embodiments, the substrate 101 is a doped silicon substrate.

Each photosensitive element 102, 104, and 106 typically converts light into an electric signal proportional to the intensity of light detected. The photosensitive element can be a photodiode or other solid state device. Other photosensitive elements also can be used as well. The resulting pixels can include, for example, amplification and readout circuitry such as one or more CMOS transistors (not shown). The resulting pixels can be devices having size of around 1.75 microns or smaller. Alternatively, the resulting pixels can be larger. For purposes of clarity, only reference numbers for photosensitive elements 102, 104, and 106 are illustrated. The photosensitive elements 102, 104, and 106 can be disposed in the substrate 101 in any suitable known manner.

A typical individual pixel in the image sensor 100 can include a stack of multiple layers including metal layers, planarization layers, and the like. As shown, the image sensor 100 includes a first metal layer having M1 conductors disposed in a dielectric material 108. For some embodiments, the first metal layer can be etched into the shape of the M1 metal conductors and the M1 conductors can be planarized by polishing. The dielectric material 108 can be deposited and/or grown to fill the gaps between the M1 conductors. The dielectric material 108 can insulate the M1 conductors from the substrate 101.

The dielectric material 108 can be any insulator such as an oxide. For some embodiments, the dielectric material can be a silicon oxide.

The M1 conductors can be copper, aluminum, an aluminum copper mixture, or other material suitable (such as polysilicon) for carrying a signal.

As shown, the image sensor 100 includes a second metal layer having M2 conductors disposed in a dielectric material 110. For some embodiments, the second metal layer can be etched into the shape of the M2 conductors and the M2 conductors can be planarized by polishing. The dielectric material 110 can be deposited and/or grown to fill the gaps between the M2 conductors. The dielectric material 110 can insulate the M1 metal conductors from the M2 metal conductors.

The dielectric material 110 can be any insulator such as an oxide. For some embodiments, the dielectric material can be a silicon oxide.

The M2 conductors can be made of a material suitable for conductors M1.

Additionally, filters are disposed over the layer defined by dielectric material 110. The filters can be aligned with photosensitive elements such that a filter 116 is aligned with the photosensitive element 102, a filter 118 is aligned with the photosensitive element 104, and a filter 120 is aligned with the photosensitive element 106. The dashed lines 130 indicate the alignment of the filters with the photosensitive elements.

The filters 116, 118, and 120 can be arranged in a suitable pattern as described below. Where, for example, the filters 116, 118, and 120 are color filters, the filters 116, 118, and 120 can be arranged in a Bayer pattern. As illustrated, the filter 116 is a blue filter in that substantially allows blue light to pass but blocks substantially all other light in the visible spectrum, the filter 118 is a green filter in that substantially allows green light to pass but blocks substantially all other light in the visible spectrum, and the filter 120 is a red filter in that substantially allows red light to pass but blocks substantially all other light in the visible spectrum. In other embodiments, the filters can be cyan, magenta (as an example of a dichroic filter), yellow, or other suitable filters.

The filters 116, 118, and 120 can be made from any suitable material. One suitable material is an acrylic—such as polymethylmethacrylate (PMMA) or polyglycidylmethacrylate (PGMA)—that has been pigmented or dyed. Other photoresist-type materials that can be dyed or pigmented can also be used for color filters.

In some embodiments, micro-lenses are disposed over the filters. As shown, a micro-lens 122 is disposed over the filter 116, a micro-lens 124 is disposed over the filter 118, and a micro-lens 126 is disposed over the filter 120. The micro-lenses are arranged to focus incident light upon the photosensitive elements such that the micro-lens 122 focuses incident light upon the photosensitive element 102, the micro-lens 124 focuses incident light upon the photosensitive element 104, and the micro-lens 126 focuses incident light upon the photosensitive element 106. The micro-lenses, filters, and other layers can be disposed using any suitable deposition, etching, masking technique as well as planarization, heating, reflow, chemical vapor deposition (CVD), plasma enhanced chemical vapor deposition (PECVD), or other suitable technique.

Image sensors are typically made using layers in the pixel stack that are substantially flat. Generally, when the photodiodes are closer to the surface of the substrate, the greater the amount of light that travels from the filters to the photodiodes.

Figure 2:
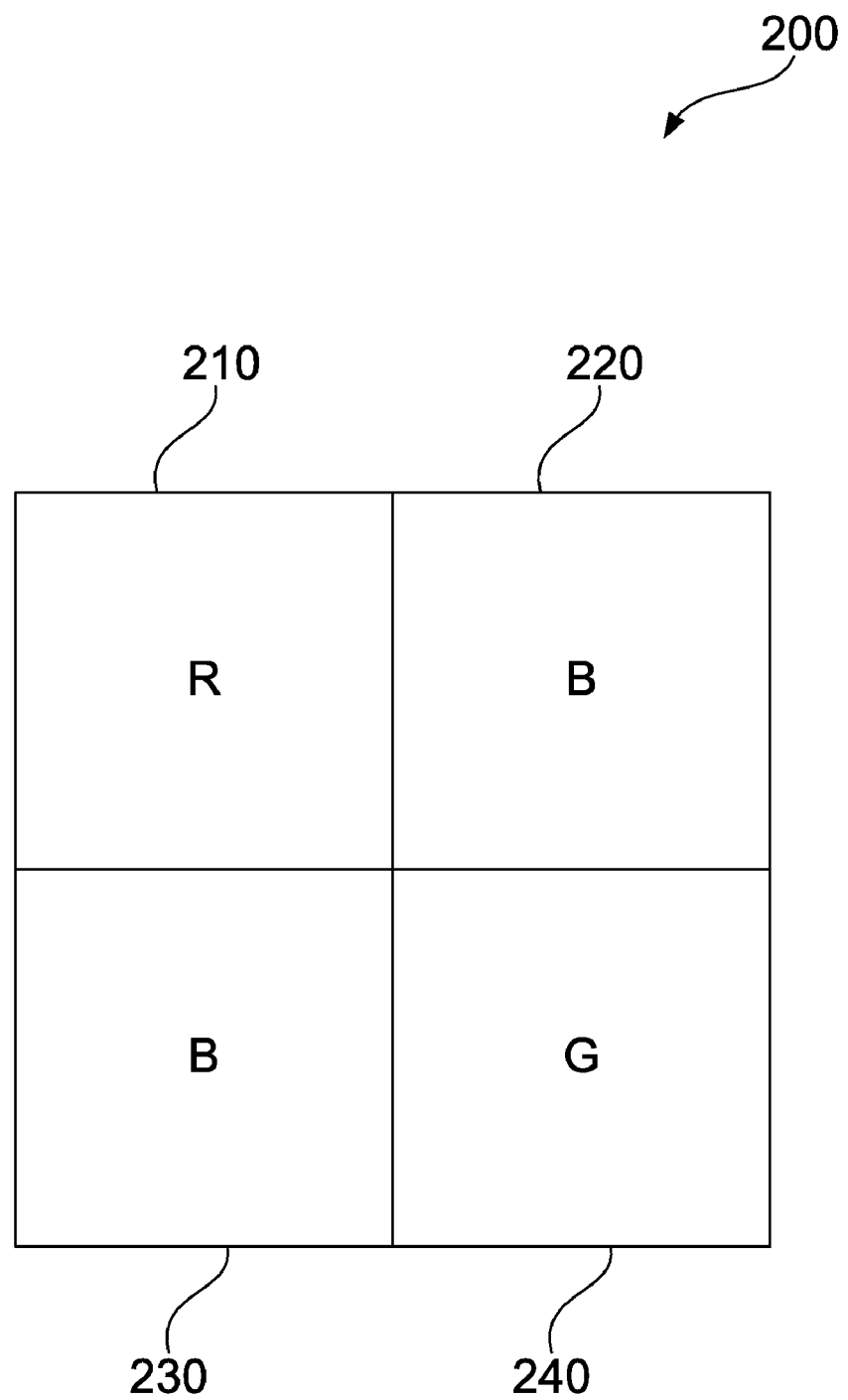
FIG. 2 is a top view illustrating a sample RGGB pattern of color filters arranged in a 2-by-2 matrix.

FIG. 2 is a top view illustrating a sample pattern of color filters arranged in a 2-by-2 matrix. For simplicity, a rectilinear matrix 200 (e.g., a square) is shown. However, other arrangements can be used for the matrix (such as by offsetting columns or rows). Matrix 200 has color filters arranged in accordance with a Bayer dither pattern. Each pixel within the matrix is normally adjacent to at least one other pixel in the matrix. Each pixel is shown as having an aspect ratio of unity, however (as shown below) other aspect ratios can be used. Pixel 210 is shown as having a red color filter. Pixel 220 and 230 are shown as having blue color filters. Pixel 240 is shown as having a green color filter.

As discussed above, pixels of image sensors are not as sensitive in the blue light wavelengths as in longer wavelengths of light. The lower sensitivity often results in dark pixels and noise. In low light situations, an image sensor having a relatively low sensitivity the image sensor will normally produce a value for the pixel that is too dark, especially when compared with pixels that are receptive to longer wavelengths of light. Additionally, as the sensitivity of the pixel decreases, the noise component of the image signal proportionately grows larger, which often results in noise that is visible and distracting. The problem of low sensitivity of pixels becomes progressively troublesome as devices are made using progressively smaller scales. Thus, the noise of blue light pixels progressively becomes worse at a faster rate than pixels that are receptive to longer wavelengths of light.

Matrix 200 lessens the impact of lessened sensitivity of the blue pixels by assigning a greater area within the matrix to blue light, a lesser area to green light, and a lesser area to red light. Thus, 50 percent of the area is devoted towards collecting blue light, 25 percent of the area is devoted towards collecting green light, and 25 percent of the area is devoted towards collecting blue light.

As mentioned above, the aspect ratio of the matrix need not be square (although other rectilinear shapes can be used). Other percentages (other than 50-25-25) can be used (such as 40-30-30). The other percentages can be chosen in accordance with a particular geometric shape that is suitable for tiling across the face of the sensor substrate.

Although current technology typically suffers from the limitation of having lessened sensitivity (per equal areas of photodiodes, for example) for blue pixels, other technologies may exist where pixels are sensitive to shorter wavelengths of light. In such a case, red pixels would be less sensitive than green or blue pixel. In accordance with the present disclosure, a matrix can include two red pixels, a green pixel, and a blue pixel.

Figure 3:
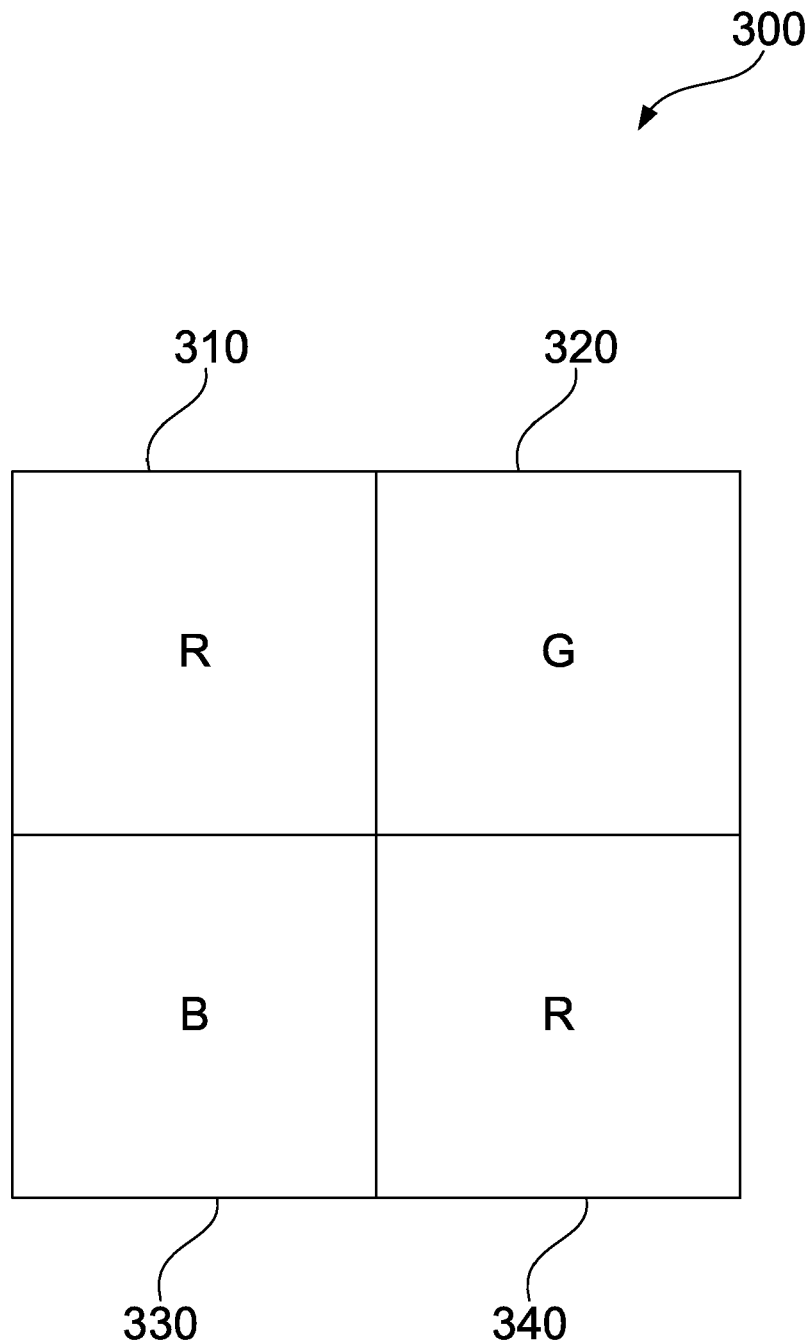
FIG. 3 is a top view illustrating a sample RRGB pattern of color filters arranged in a 2-by-2 matrix.

FIG. 3 is a top view illustrating another sample pattern of color filters arranged in a 2-by-2 matrix. The sample pattern is shown as matrix 300. As discussed above, other arrangements can be used for the matrix (such as by offsetting columns or rows). Matrix 300 has color filters arranged in accordance with a Bayer dither pattern. Pixels 310 and 340 are shown as having a red color filter. Pixel 320 is shown as having a green color filter. Pixel 330 is shown as having a blue color filter.

Figure 4:
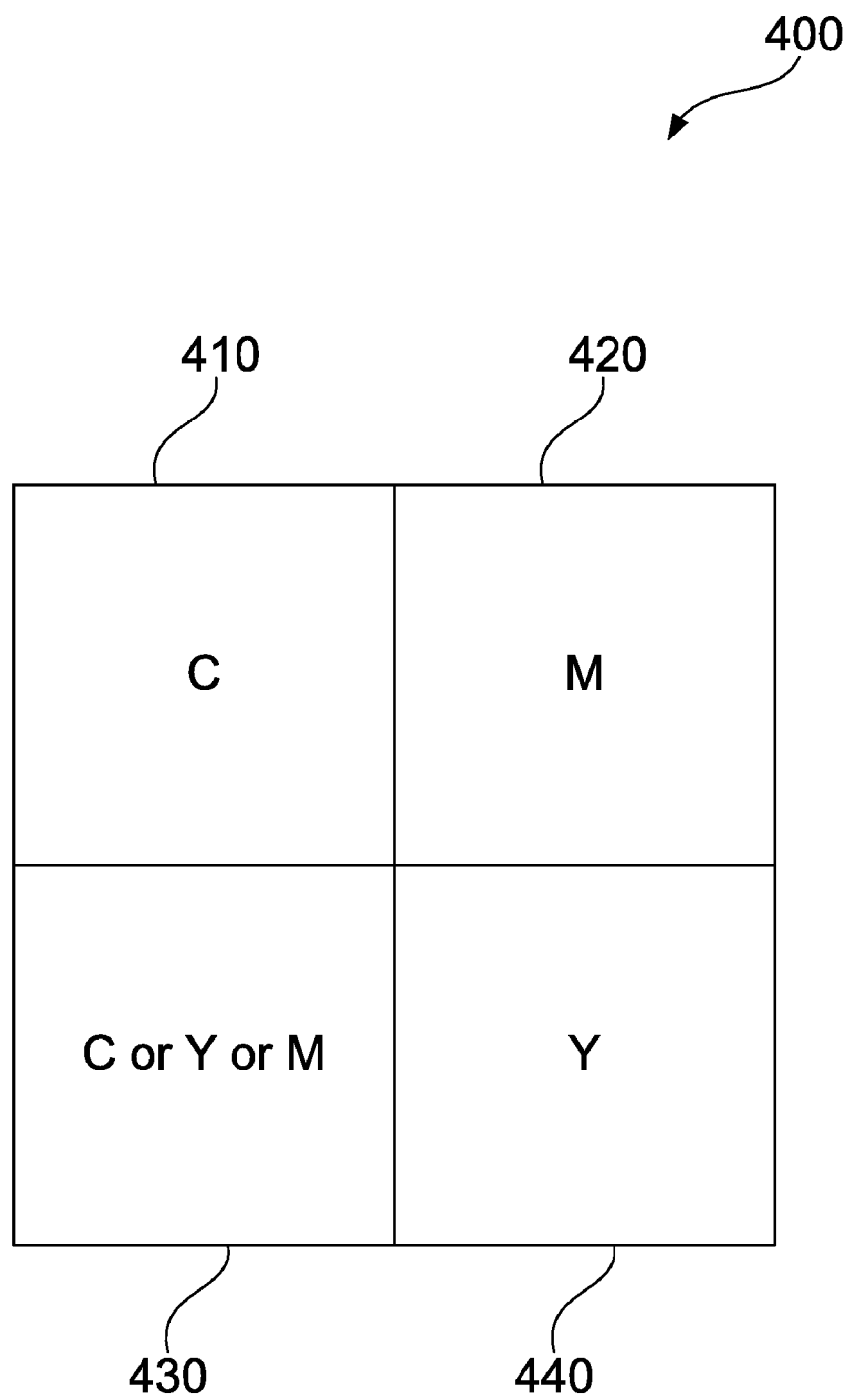
FIG. 4 is a top view illustrating a sample CYM-system pattern of color filters arranged in a 2-by-2 matrix.

FIG. 4 is a top view illustrating another sample pattern of color filters arranged in a 2-by-2 matrix. The sample pattern is shown as matrix 400. As discussed above, other arrangements can be used for the matrix (such as by offsetting columns or rows). Matrix 400 has cyan, magenta, and yellow color filters arranged in a dither pattern. Pixel 410 is shown as having a cyan color filter. Pixel 420 is shown as having a magenta color filter. Pixel 440 is shown as having a yellow color filter. Pixel 430 can have a color filter selected in accordance with the following discussion for FIGS. 5 and 6 below. Pixels 410, 420, 430, and 440 can be arranged such that if two of the filters pass a substantial amount of light of the same frequencies, the two filters can be arranged such that the filters are diagonally adjacent (e.g., in opposing corners of a 4-by-4 matrix).

Where two adjacent pixels (e.g., vertically, horizontally, and/or diagonally adjacent pixels) have the same assigned color, the pixels can be combined at various levels. For example, when pixel 430 has a yellow filter, various elements of pixels 430 (such as the micro-lens, photodiode, filter, and the like) can be combined with corresponding elements of pixel 440.

Figure 5:
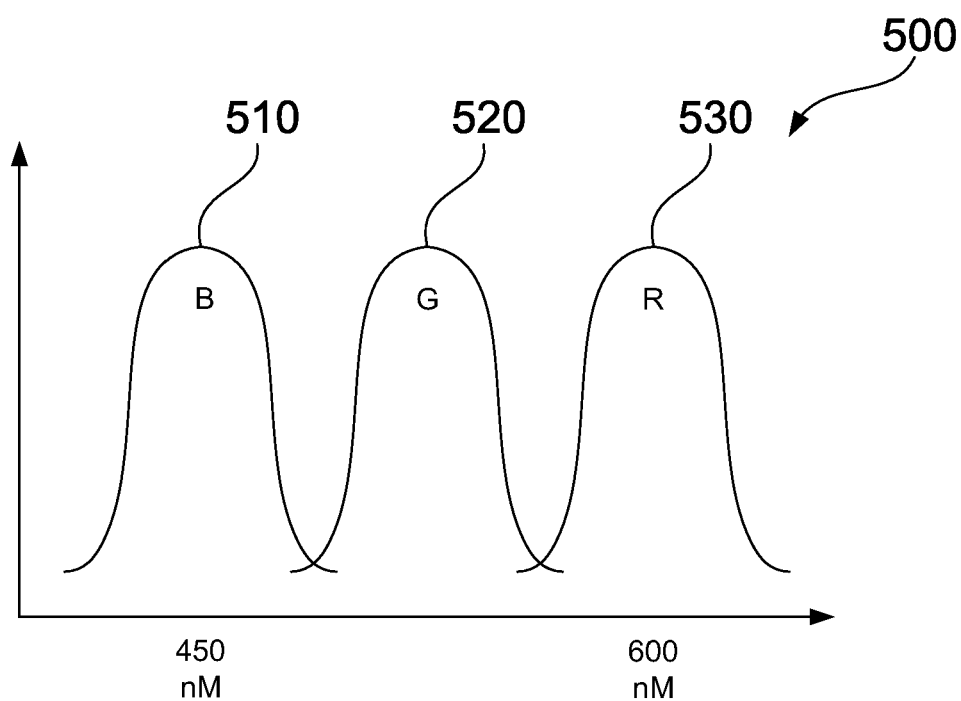
FIG. 5 is a graph illustrating the transfer function of an RGB filter system.

FIG. 5 is a graph illustrating the transfer function of an RGB filter system. Filter system 510 includes "notch" filters 510, 520, and 530. Filter 510 passes (blue) light having wavelengths centered around 450 nanometers. Filter 520 passes (green) light having wavelengths centered around 530 nanometers. Filter 530 passes (red) light having wavelengths centered around 600 nanometers. In an example where a pixel of an image sensor is less sensitive to blue light, two out of four pixels can be assigned to receiving blue light as discussed relative to FIG. 2. Thus, an image sensor (having more area assigned to capture light of wavelengths to which the image sensor is less sensitive) can more faithfully capture images in low light situations, while allowing higher scales of integration.

Figure 6:
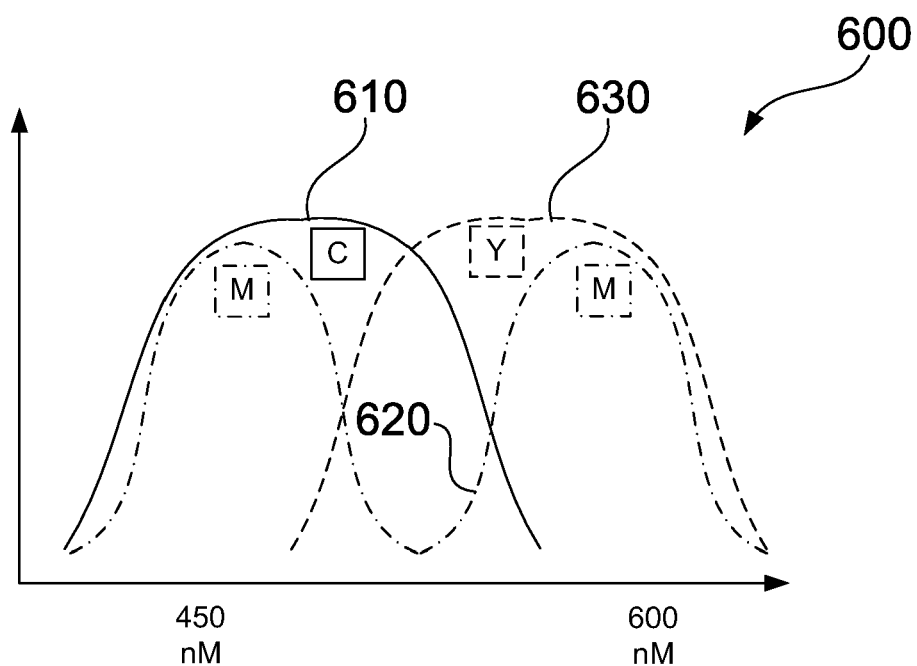
FIG. 6 is a graph illustrating the transfer function of an CYM filter system.

FIG. 6 is a graph illustrating the transfer function of an CYM filter system. Filter system 600 includes "bandpass" filters 610 and 630 and "comb" filter 620. Filter 610 passes (cyan) light having wavelengths from around 400 nanometers to around 550 nanometers. Filter 630 passes (yellow) light having wavelengths around 500 nanometers to around 650 nanometers. Filter 620 passes dichroic (e.g., magenta) light in two bands having wavelengths centered around 450 nanometers and 600 nanometers (but not passing "green" light having a wavelength centered around 530 nanometers). In an example where a pixel of an image sensor is less sensitive to blue light, two out of four pixels can be assigned to receiving cyan light, which substantially increases the amount of blue light being sampled. In view of the present disclosure, it can be seen that selecting a magenta filter (for two of four lenses in a sensor that is less sensitive to light of shorter wavelengths) can also increase the sensitivity of the pixel because magenta light includes blue light.

In an example where an image sensor is most sensitive to green light (as is similar to the human vision system), selecting magenta for two of the four filters would substantially increase the amount of non-green light (i.e., magenta) such that the resulting captured image more faithfully reproduces the original scene. Likewise selecting yellow for two of the four filters would be appropriate for a pixel that was more sensitive to longer wavelengths of light.

Figure 7:
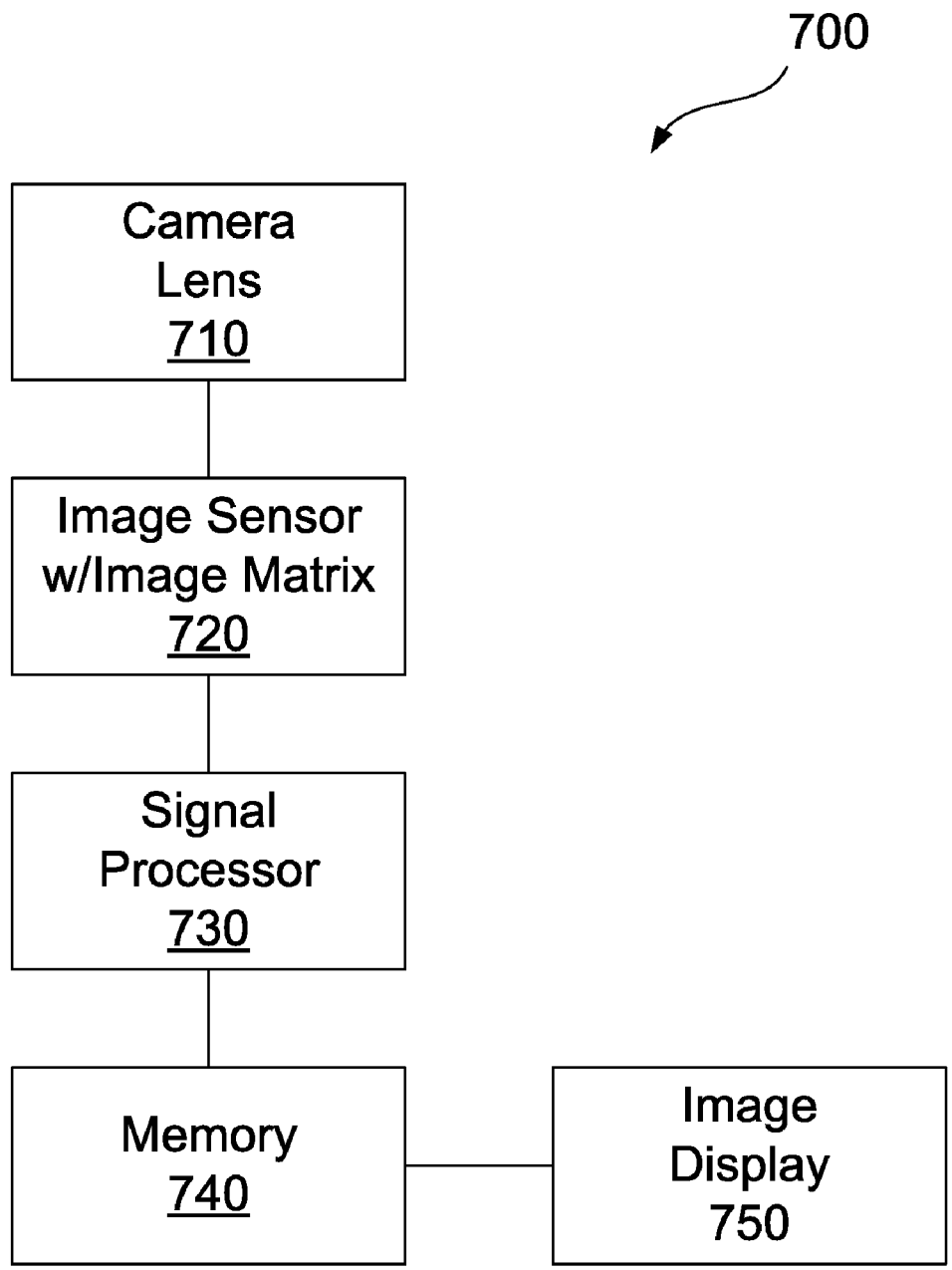
FIG. 7 is a high level block diagram illustrating a sample imaging device.

FIG. 7 is a high level block diagram illustrating a sample imaging device. The imaging device 700 can be any device capable of producing still or video images. In the illustrated imaging device 700, a camera lens 710 is coupled to an image sensor 720, which can have the photosensitive array with filters patterned in accordance with the photosensitivity of pixels in the array to various wavelengths of light.

The image sensor 720 is coupled to a signal processing block 730 that can be used to normalize and transform the captured electronic image in accordance with the transfer function of the supplied filters. The signal processing block 703 is coupled to a memory 740. The memory is coupled to an image display device 750. The camera lens 710 can be separate from or located next to the image sensor 720. The imaging device 700 can be part of a camera for a television production studio or a digital photographic camera.

The imaging device 700 can operate as follows. Visible light and infrared light can be incident on camera lens 710, which passes the visible light and near-infrared and/or infrared light to the image sensor 720. The image sensor 720 produces electrical signals from visible light and are processed in the signal processing block 730. The signal processing can include analog to digital conversion of signals and digital signal processing, for example.

The electrical signals can be stored in the memory 740, displayed on the image display 750, and/or broadcast to a receiver (not shown). In some embodiments the signal processor contains an interface that is capable of communicating with other electronic devices.

Embodiments of the present invention can be implemented using hardware, software, or a combination thereof. In implementations using software, the software or machine-readable data can be stored on a machine-accessible medium. The machine-readable data can be used to cause a machine, such as, for example, a processor (not shown) to perform the method and processes herein. A machine-readable medium includes any mechanism that can be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.), such as electrical, optical, acoustic, or other form of propagated signals (e.g., carrier waves, infrared signals, digital signals, etc.).

The operations of the methods herein have been described as multiple discrete blocks performed in turn in a manner that can be most helpful in understanding embodiments of the invention. However, the order in which they are described should not be construed to imply that these operations are necessarily order dependent or that the operations be performed in the order in which the blocks are presented. Of course, the methods are sample methods and other methods can be used to implement embodiments of the present invention.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An image sensor, comprising:
an array of photosensitive elements formed using a semiconductor substrate, wherein each photosensitive element optically communicates with a unique portion of a filter, wherein the photosensitive elements have a frequency sensitivity band that provides a lowered response to incident light of a region of frequencies relative to other frequencies in the frequency sensitivity band of the photosensitive elements, and wherein the array comprises a plurality of unit matrixes, wherein each unit matrix comprises:
a first filter, a second filter, and a third filter, wherein each filter provides a filter function that is substantially different than the filter functions of the other filters; and
a fourth filter that provides a filter function that is substantially equal to one of the first, second, or third filters, and wherein the fourth filter passes light in a lowest response frequency sensitivity band of the first, second, and third filters and wherein the lowest response frequency sensitivity band corresponds to the region of frequencies to which the photosensitive elements have the lowered response to the incident light.

2. The image sensor of claim 1, wherein the lowest response frequency sensitivity band of the first, second, and third filters comprises blue light.

3. The image sensor of claim 2, wherein the fourth filter passes blue light.

4. The image sensor of claim 1, wherein the lowest response frequency sensitivity band of the first, second, and third filters comprises light of blue and green wavelengths.

5. The image sensor of claim 4, wherein the fourth filter passes blue light.

6. The image sensor of claim 4, wherein the fourth filter passes green light.

7. The image sensor of claim 4, wherein the fourth filter passes cyan light.

8. A camera, comprising:
a lens disposed in an optical path to an array of photosensitive elements;
the array of photosensitive elements formed using a semiconductor substrate, wherein the photosensitive elements have a frequency sensitivity band that provides a lowered response across incident light of a region of frequencies communicated from the lens relative to other frequencies in the frequency sensitivity band of the photosensitive element; and
an array of filter matrixes, wherein each filter matrix comprises:
a first filter, a second filter, and a third filter, wherein each filter provides a filter function that is substantially different than the filter functions of the other filters; and
a fourth filter that provides a filter function that is equal to one of the first, second, or third filters, and wherein the fourth filter passes light in a lowest response frequency sensitivity band of the first, second, and third filters and wherein the lowest response frequency sensitivity band corresponds to the region of frequencies to which the photosensitive elements have the lowered response to the incident light.

9. The camera of claim 8, further comprising circuitry to process signals from the array of photosensitive elements.

10. The camera of claim 9, further comprising circuitry to generate images from the processed signals.

11. The camera of claim 10, further comprising memory to store the images generated.

12. A method for operating an image sensor, comprising:
receiving light at an array of photosensitive elements formed using a semiconductor substrate, wherein the photosensitive elements have a lowered response frequency sensitivity band that provides a lowered response to incident light of a region of frequencies relative to other frequencies in the frequency sensitivity band of the photosensitive elements;
filtering the received light using a first optical filter function having a first frequency response;
filtering the received light using a second optical filter function having a second frequency response;
filtering the received light using a third optical filter function having a third frequency response; and
filtering the received light using a fourth optical filter function having a fourth frequency response, wherein the first frequency response, the second frequency response, and the third frequency response are used to form pixel values for a first color, a second color, and a third color, respectively, wherein the fourth frequency response is equal to the first frequency response and the fourth optical filter function is combined with the first optical filter function to form the pixel value for the first color, and wherein the fourth frequency response passes light in a lowest response frequency sensitivity band of the first, second, and third optical filter functions and wherein the lowest response frequency sensitivity band corresponds to the region of frequencies to which the photosensitive elements have the lowered response to the incident light.

13. The method of claim 12, further comprising:
processing signals from using the first, second, third, and fourth frequency responses; and
generating and storing an image from the processed signals.

14. The method of claim 12, wherein the first frequency response optically passes blue light.

15. The method of claim 12, wherein the second frequency response optically passes magenta light.

16. The method of claim 12, wherein the second frequency response optically passes dichroic light.

17. The method of claim 12, wherein four pixels provide pixel values in accordance with the first, second, third, and fourth frequency responses, wherein each of the four pixels has a boundary that is adjacent to at least one other of the four pixels.

18. The method of claim 17, wherein the pixel value is in given using CYM values.

19. The method of claim 12, wherein the pixel value is in given using RGB values.

* * * * *